US008294483B2

(12) United States Patent
Pessoa et al.

(10) Patent No.: US 8,294,483 B2
(45) Date of Patent: Oct. 23, 2012

(54) TESTING OF MULTIPLE INTEGRATED CIRCUITS

(75) Inventors: Lucio F. C. Pessoa, Cedar Park, TX (US); Perry H. Pelley, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 180 days.

(21) Appl. No.: 12/130,173

(22) Filed: May 30, 2008

(65) Prior Publication Data

US 2009/0295415 A1    Dec. 3, 2009

(51) Int. Cl.
  *G01R 31/26* (2006.01)
  *G01R 31/28* (2006.01)
(52) U.S. Cl. ......... 324/762.01; 324/754.31; 324/762.02; 324/762.05; 714/733; 714/758; 702/108
(58) Field of Classification Search .......... 324/750–765; 714/733, 758; 702/182
See application file for complete search history.

(56) References Cited

U.S. PATENT DOCUMENTS

| | | | |
|---|---|---|---|
| 4,330,870 A | 5/1982 | Arends | |
| 5,321,542 A | 6/1994 | Freitas et al. | |
| 5,561,846 A | 10/1996 | Hagio | |
| 5,598,290 A | 1/1997 | Tanaka et al. | |
| 5,619,361 A | 4/1997 | Sagesaka et al. | |
| 5,638,052 A | 6/1997 | Furuya et al. | |
| 5,639,989 A | 6/1997 | Higgins, III | |
| 5,696,500 A | 12/1997 | Diem | |
| 6,236,223 B1 * | 5/2001 | Brady et al. | .......... 324/765 |
| 6,271,815 B1 | 8/2001 | Yang et al. | |
| 6,307,169 B1 | 10/2001 | Sun et al. | |
| 6,307,452 B1 | 10/2001 | Sun | |
| 6,362,018 B1 | 3/2002 | Xu et al. | |
| 6,384,353 B1 | 5/2002 | Huang et al. | |
| 6,410,941 B1 | 6/2002 | Taylor et al. | |
| 6,411,111 B1 | 6/2002 | Gao et al. | |
| 6,441,449 B1 | 8/2002 | Xu et al. | |

(Continued)

FOREIGN PATENT DOCUMENTS

EP    1564914 B1    10/2003

(Continued)

OTHER PUBLICATIONS

Yayla, G.I., et al., "Speed and energy analysis of digital interconnections: comparison of on-chip, off-chip, and free-space technologies" Applied Optics, Jan. 10, 1998, vol. 37, No. 2, pp. 205-227.

(Continued)

*Primary Examiner* — Melissa Koval
*Assistant Examiner* — Emily Y Chan
(74) *Attorney, Agent, or Firm* — James L. Clingan, Jr.; Joanna G. Chiu

(57) ABSTRACT

A testing system includes a tester probe and a plurality of integrated circuits. Tests are broadcast to the plurality of integrated circuits using carrierless ultra wideband (UWB) radio frequency (RF). All of the plurality of integrated circuits receive, at the same time, test input signals by way of carrierless UWB RF and all of the plurality of integrated circuits run tests and provide results based on the test input signals. Thus, the plurality of integrated circuits are tested simultaneously which significantly reduces test time. Also the tests are not inhibited by physical contact with the integrated circuits.

3 Claims, 3 Drawing Sheets

U.S. PATENT DOCUMENTS

| | | | |
|---|---|---|---|
| 6,445,369 B1 | 9/2002 | Yang et al. | |
| 6,459,344 B1 | 10/2002 | Pavio et al. | |
| 6,590,410 B2 | 7/2003 | Hirt | |
| 6,717,430 B2 | 4/2004 | Burch | |
| 6,815,973 B1 | 11/2004 | Conn | |
| 6,830,221 B1 | 12/2004 | Janson et al. | |
| 6,842,144 B2 | 1/2005 | Guo et al. | |
| 6,845,670 B1 | 1/2005 | McNeil et al. | |
| 6,870,444 B1 | 3/2005 | Zurcher et al. | |
| 6,885,202 B2* | 4/2005 | Slupsky | 324/753 |
| 6,891,991 B2 | 5/2005 | Klosowiak et al. | |
| 6,897,663 B1 | 5/2005 | Conn | |
| 6,921,975 B2 | 7/2005 | Leal et al. | |
| 6,936,942 B1 | 8/2005 | Okazaki et al. | |
| 6,953,994 B2 | 10/2005 | Kaewell, Jr. | |
| 6,995,889 B2 | 2/2006 | Li et al. | |
| 7,020,400 B2 | 3/2006 | Trezza et al. | |
| 7,057,518 B2* | 6/2006 | Schmidt | 340/635 |
| 7,109,460 B2 | 9/2006 | Diamanstein et al. | |
| 7,121,141 B2 | 10/2006 | McNeil | |
| 7,904,768 B2* | 3/2011 | Wu et al. | 714/724 |
| 2003/0056196 A1 | 3/2003 | Kim et al. | |
| 2004/0008142 A1 | 1/2004 | Guo et al. | |
| 2004/0008992 A1 | 1/2004 | Nishimura | |
| 2004/0100376 A1* | 5/2004 | Lye et al. | 340/539.12 |
| 2004/0164760 A1* | 8/2004 | Moore | 324/765 |
| 2005/0070226 A1 | 3/2005 | Rigge | |
| 2005/0073045 A1 | 4/2005 | Kaewell, Jr. | |
| 2005/0075080 A1 | 4/2005 | Zhang | |
| 2005/0130698 A1 | 6/2005 | Won | |
| 2005/0138499 A1* | 6/2005 | Pileggi et al. | 714/724 |
| 2005/0232638 A1 | 10/2005 | Fucile et al. | |
| 2005/0253225 A1 | 11/2005 | Kaewell, Jr. | |
| 2005/0285541 A1 | 12/2005 | LeChevalier | |
| 2006/0048006 A1 | 3/2006 | Lou | |
| 2006/0056855 A1 | 3/2006 | Nakagawa et al. | |
| 2006/0172719 A1 | 8/2006 | Chen et al. | |
| 2006/0179374 A1 | 8/2006 | Noble | |
| 2007/0091814 A1* | 4/2007 | Leung et al. | 370/252 |
| 2007/0182438 A1* | 8/2007 | Khandros et al. | 324/765 |
| 2007/0300125 A1* | 12/2007 | Xia et al. | 714/758 |
| 2008/0130689 A1 | 6/2008 | Kumar et al. | |
| 2008/0204055 A1* | 8/2008 | Pagani | 324/750 |
| 2009/0153158 A1* | 6/2009 | Dunn et al. | 324/750 |
| 2009/0297146 A1* | 12/2009 | Pessoa et al. | 398/45 |

FOREIGN PATENT DOCUMENTS

| | | |
|---|---|---|
| WO | 9942984 | 8/1999 |
| WO | 9942985 | 8/1999 |
| WO | 9949435 | 9/1999 |

OTHER PUBLICATIONS

Bansal, R., Near-Field Magnetic Communication, IEEE Antennas and Propagation Magazine, vol. 46, No. 2, Apr. 2004, pp. 14-15.

Bravo, D., et al., Estimation of the Signal-to-Noise Ratio for On-Chip Wireless Clock Signal Distribution, 2000, p. 9-11.

Brown, E.R., "RF-MEMS Switches for Reconfigurable Integrated Circuits", IEEE Transactions on Microwave Theory and Techniques, vol. 46, No. 11, Nov. 1998, pp. 1868-1879.

Chang, M.F., et al., "Advanced RF/Baseband Interconnect Schemes for Inter- and Intra-ULSI Communications", IEEE Transactions on Electron Devices, vol. 52, No. 7, Jul. 2005, pp. 1271-1285.

Chang, M.F., et al., "Multi-I/O and Reconfigurable RF/Wireless Interconnect Based on Near Field Capacitive Coupling and Multiple Access Techniques", IEEE International Interconnect Technology Conference, 2000, pp. 21-22.

Chang, M.F., et al., "RF/Wireless Interconnect for Inter- and Intra-Chip Communications", Proceedings of the IEEE, vol. 89, No. 4, Apr. 2001, pp. 456-466.

Chen, G. et al., "Electrical and Optical On-Chip Interconnects in Scaled Microprocessors", IEEE International Symposium on Circuits and Systems, vol. 3, 2005, pp. 2514-2517.

Ciattaglia, M., et al., "Investigation on Antenna Coupling in Pulsed Arrays", IEEE Transactions on Antennas and Propagation, vol. 54, No. 3, Mar. 2006, pp. 835-843.

Djahani, P., et al., "Analysis of Infrared Wireless Links Employing Multibeam Transmitters and Imaging Diversity Receivers", IEEE Transactions on Communications, vol. 48, No. 12, Dec. 2000, pp. 2077-2088.

Du Plessis, M., et al., "Spatial and Intensity Modulation of Light Emission from a Silicon LED Matrix", IEEE Photonics Technology Letters, vol. 14, No. 6, Jun. 2002, pp. 768-770.

Floyd, B.A., et al., "Intra-Chip Wireless Interconnect for Clock Distribution Implemented with Integrated Antennas, Receivers, and Transmitters", IEEE Journal of Solid-State Circuits, vol. 37, No. 5, May 2002, pp. 543-552.

Goodman, J.W., et al., "Optical Interconnections for VLSI Systems", Proceedings of the IEEE, vol. 72, No. 7, Jul. 1984, pp. 850-866.

Guo, X., et al., "Propagation Layers for Intra-Chip Wireless Interconnection Compatible with Packaging and Heat Removal", IEEE Symposium on VLSI Technology Digest of Technical Papers, 2002, pp. 36-37.

Havemann, R.H., "High-Performance Interconnects: An Integration Overview", Proceedings of the IEEE, vol. 89, No. 5, May 2001, pp. 586-601.

Sponsor: Test Technology Standards Committee of the IEEE Computer Society, "IEEE Standard Test Access Port and Boundary-Scan Architecture", IEEE Std. 1149.1 TM—2001 (R2008) (revision of IEEE Std. 1149.1-1990); Reaffirmed Mar. 27, 2008, Approved Jun. 14, 2001, 208 pgs.

ITRS, "International Technology Roadmap for Semiconductors, 2005 Edition, Interconnect", 64 pgs.

Jalali, B., et al., "Silicon Photonics", IEEE Microwave Magazine, Jun. 2006, pp. 58-68.

Kahn, J.M.,et al., "Imaging Diversity Recievers Wireless High-Speed Infrared Wireless Communication", IEEE Communications Magazine, Dec. 1998, pp. 88-94.

Kim, K., et al., "On-Chip Wireless Interconnection with Integrated Antennas" IEEE International Electron Devices Meeting, IEDM Technical Digest, 2000, pp. 485-488.

Komine, T., et al., "Fundamental Analysis for Visible-Light Communication System using LED Lights", IEEE Transactions on Consumer Electronics, vol. 50, No. 1, Feb. 2004, pp. 100-107.

Lucyszyn, S., "Review of radio frequency microelectromechanical systems technology", IEEE Proc.-Sco. Meas. Technol. vol. 151, No. 2, Mar. 2004, pp. 93-103.

Meuris, P., et al., "Strategy for Electromagnetic Interconnect Modeling", IEEE Transactions on Computer-Aided Design of Integrated Circuits and Systems, vol. 20, No. 6, Jun. 2001, pp. 753-762.

Miller, D.A.B., et al., "Limit to the Bit-Rate Capacity of Electrical Interconnects from the Aspect Ratio of the System Architecture", Journal of Parallel and Distributed Computing, vol. 41, Oct. 1996, pp. 45-52.

Miller, D.A.B., "Rationale and Challenges for Optical Interconnects to Electronic Chips", Proceedings of the IEEE, vol. 88, No. 6, Jun. 2000, pp. 728-749.

Petit, L., "MEMS-Switched Parasitic-Antenna Array for Radiation Pattern Diversity", IEEE Transactions on Antennas and Propagation, vol. 54, No. 9, Sep. 2006, pp. 2624-2631.

Saha, P.K., et al., "A CMOS UWB Transmitter for Intra/Inter-chip Wireless Communication", ISSSTA2004, Sydney, Australia, Aug. 30-Sep. 2, 2004, IEEE, pp. 962-966.

Saraswat, K.C., et al., "Effect of Scaling of Interconnections on the Time Delay of VLSI Circuits", IEEE Transactions on Electron Devices, vol. ED-29, No. 4, Apr. 1982, pp. 645-650.

Schoebel, J., "Design Considerations and Technology Assessment of Phased-Array Antenna Systems With RF MEMS for Automotive Radar Applications", IEEE Transactions on Microwave Theory and Techniques, vol. 53, No. 6, Jun. 2005, pp. 1968-1975.

Schoenmaker, W., et al., "Electromagnetic Interconnects and Passives Modeling: Software Implementation Issues", IEEE Transactions on Computer-Aided Design of Integrated Circuits and Systems, vol. 21, No. 5, May 2002, pp. 534-543.

Sun, M., et al., "Performance of Inter-Chip RF-Interconnect Using CPW, Capacitive Coupler, and UWB Transceiver", IEEE Transactions on Microwave Theory and Techniques vol. 53, No. 9, Sep. 2005, pp. 2650-2655.

Yang, L., et al., "Ultra-Wideband Communications", IEEE Signal Processing Magazine, Nov. 2004, pp. 26-54.

Zhang, Y.P., "Bit-Error-Rate Performance of Intra-Chip Wireless Interconnect Systems", IEEE Communications Letters, vol. 8, No. 1, Jan. 2004, pp. 39-41.

International Telecommunication Union (ITU), "ITU-T, G.984.1, Gigabit-capable Passive Optical Networks (GPON): General characteristics", Series G: Transmission Systems and Media, Digital Systems and Networks, Digital sections an digital line system—Optical line systems for local and access networks, Mar. 2003, 22 pgs.

International Telecommunication Union (ITU), "ITU-T, G.984.2, Gigabit-capable Passive Optical Networks (GPON): Physical Media Dependent (PMD) layer specification", Series G: Transmission Systems and Media, Digital Systems and Networks, Digital sections and digital line system—Optical line systems for local and access networks, Mar. 2003, 38 pgs.

International Telecommunication Union (ITU), "ITU-T, G.984.3, Gigabit-capable Passive Optical Networks (GPON): Transmission convergence layer specification", Series G: Transmission Systems and Media, Digital Systems and Networks, Digital sections and digital line system—Optical line systems for local and access networks, Feb. 2004, 116 pgs.

International Telecommunication Union (ITU), "ITU-T, G.984.4, Gigibit-capable Passive Optical Networks (GPON): ONT management and control interface specification", Series G: Transmission Systems and Media, Digital Systems and Networks, Digital sections and digital line system—Optical line systems for local and access networks, Jun. 2004, 114 pgs.

Luxtera Website, Optical Interconnects, Luxtera optical technology; Fiber will Display Copper Sooner Than you Think, 2005.

U.S. Appl. No. 12/130,184, "Multiple Core System", Office Action for related application, Rejection, Inventor L.F.C. Pessoa, et al., mailed Mar. 11, 2011.

* cited by examiner

TESTING OF MULTIPLE INTEGRATED CIRCUITS

CROSS-REFERENCE TO RELATED APPLICATION(S)

This application is related to U.S. patent application Ser. No. 12/130,184, filed on even date, entitled "Multiple Core System," naming Lucio F. C. Pessoa as inventor, and assigned to the current assignee hereof.

BACKGROUND

1. Field

This disclosure relates generally to integrated circuits, and more specifically, to testing integrated circuits.

2. Related Art

Integrated circuit testing is a portion of integrated circuit manufacturing that continues to be required. Much effort has been placed on reducing testing time but such reduction has been difficult because the circuits being tested continue to increase in complexity. Just keeping test times the same requires advancements. Another desirable result, although difficult to achieve, is testing at the wafer level. Wafer level testing is commonly done as a partial test, called probe testing, by which die are separated into good die and defective die and more thorough testing is performed after the die have been packaged because not all of the necessary testing can be effectively performed at the wafer level. Further probing itself is inherently slow because it is a physical process in which a probe is serially moved from die to die to perform tests.

Accordingly, there is a need to improve the speed by which integrated circuits are tested.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect a testing system includes a tester probe and a plurality of integrated circuits. Tests are broadcast to the plurality of integrated circuits using carrierless ultra wideband (UWB) radio frequency (RF). All of the plurality of integrated circuits receive, at the same time, test input signals by way of carrierless UWB RF and all of the plurality of integrated circuits run tests and provide results based on the test input signals. Thus, the plurality of integrated circuits are tested simultaneously which significantly reduces test time. Also the tests are not inhibited by physical contact with the integrated circuits. This is better understood by reference to the drawings and the following specification.

Figure 1:
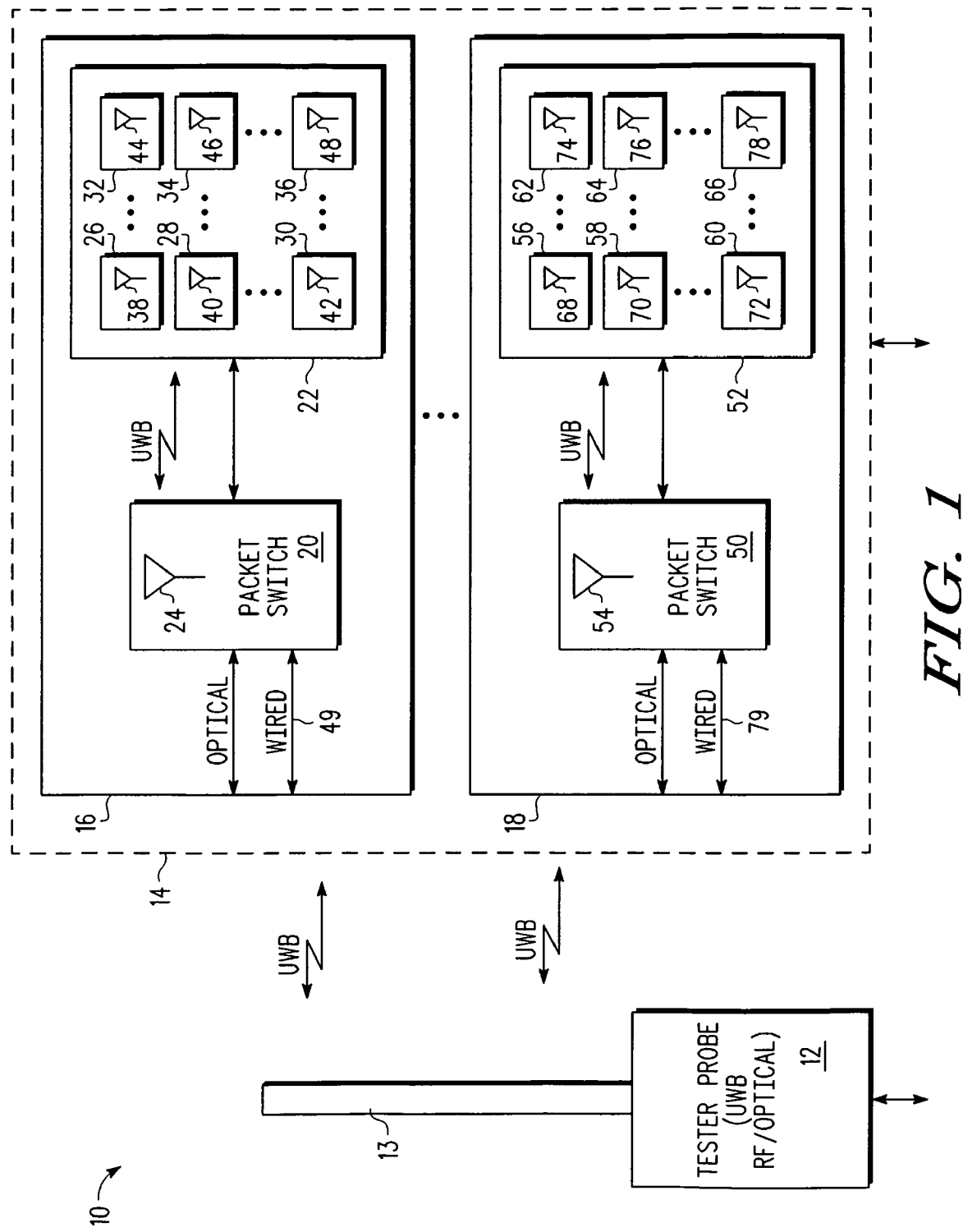
FIG. 1 is a diagram of a system according to an embodiment.

Shown in FIG. 1 is a system 10 comprising a tester probe 12, and a completed semiconductor system 14 which may be a wafer and called wafer 14. Completed wafer 14 comprises a plurality of integrated circuits including integrated circuits 16 and 18. Integrated circuit 16 comprises a packet switch 20 and a core group 22. Core group 22 comprises a plurality of cores including a core 26, core 28, core 30, core 32, core 34, and a core 36. Cores 26, 28, 30, 32, 34, and 36 include antennas, 38, 40, 42, 44, 46, and 48, respectively. Integrated circuit 16 includes a wired input/output 49. Integrated circuit 18 has the same components as integrated circuit 16. Integrated circuit 18 comprises a packet switch 50 and a core group 52. Core group 52 comprises a plurality of cores including a core 56, core 58, core 60, core 62, core 64, and a core 66. Cores 56, 58, 60, 62, 64, and 66 include antennas, 68, 70, 72, 74, 76, and 78, respectively. Integrated circuit 18 includes a wired input/output 79. Tester probe 12 includes an antenna structure 13.

In a test mode, tester probe 12 outputs a carrierless UWB RF signal that includes test instructions using antenna structure 13. Antenna structure 13 may include more than one antenna. The test instructions are received by the integrated circuits of completed wafer 14 including integrated circuits 16 and 18. In particular, antennas 24 and 54 receive the test signals. Packet switch 20 interprets the test signals and transmits corresponding core test signals, as a carrierless UWB RF signal, using antenna 24 to antennas 38-48. Cores 26-36 perform tests according to the core test signals received by antennas 38-48, respectively. Similarly, packet switch 50 interprets the test signals and transmits corresponding core test signals as a carrierless UWB RF signal using antenna 54 to antennas 68-78. Cores 56-66 perform tests according to the core test signals received by antennas 68-78, respectively. Cores 26-36 communicate results, as a carrierless UWB RF signal, of running the tests to packet switch 20 from antennas 38-48 to antenna 24. Similarly, cores 56-66 communicate results, as a carrierless UWB RF signal, of running the tests to packet switch 50 from antennas 68-78 to antenna 54. Packet switch 20 provides the results external to integrated circuit 16 by carrierless UWB RF, wired, and/or optical signaling. Similarly, packet switch 50 provides the results external to integrated circuit 18 by carrierless UWB RF, wired, and/or optical signaling. For test results, it is likely that the bandwidth requirements for the data may be met by all of the following three options: carrierless UWB RF, wired, and optical signaling. In the case of using carrierless UWB RF, each of packet switches 20 and 50 may include a code unique for each integrated circuit so that tester probe can determine which results apply to which integrated circuit. Also power will likely be increased over that for communicating among the cores. Thus, the result is that multiple integrated circuits can simultaneously be tested. Further these tests are not functionally limited by physical contact probes which introduce capacitance and require probe pads on the integrated circuit. Thus, the integrated circuits may be fully tested. This can allow for shipping fully tested wafers, even after wafer level burn-in. It can also allow for testing or debugging of integrated circuits within their packages during normal operation. For example, debugging application software of a complex system that is executed by one or more cores can be performed much more effectively as the tester probe has a large capacity for communicating debugging information to/from the one or more cores.

Integrated circuits 16 and 18, if they pass the tests, may be singulated and packaged and included in a processing system. In normal operation of integrated circuit 16, for example, core group 22 performs processor operations as a multicore system. Cores 26-36 communicate among themselves by carrierless UWB RF using antennas 38-48 and communicate with packet switch 20 also by carrierless UWB RF. Antennas 38-48 within integrated circuit 16 also allow for testing or debugging during normal operation. Core group 22 can have a very large number of cores generating information that is communicated to packet switch 20. Thus, the information being transmitted to packet switch 20 can be so large that the capacity of the carrierless UWB RF bandwidth may be exceeded. Packet switch 20 has an optical interface that has a much greater capacity, typically more than an order of magnitude, than carrierless UWB RF.

Carrierless UWB RF is very convenient for communicating with and among cores. Carrierless UWB RF is a type of UWB RF. UWB RF can be broadcast over circuitry without disturbing the circuitry because it is spread over a wide frequency range. The affect is that no single frequency band has enough energy to disturb circuitry. Carrierless UWB RF does this as well but with a further benefit of not needing to generate a high frequency signal for a carrier. Generating a carrier typically requires precision circuitry for generating a sinusoidal signal at high frequency. Such a circuit requires much power and sophisticated circuitry for maintaining the required tight control of the frequency. Accordingly, carrierless UWB RF, which may use impulses for identifying logic highs and logic lows. An impulse, in the frequency domain, has its energy spread over a wide frequency range and so is perceived as low energy noise by other circuitry. Of course in practice a perfect impulse is not possible, but the technology has developed so that the frequency range does extend into the RF range. Thus, these impulses may be transmitted from an antenna as an electromagnetic wave and received by another antenna. A logic high may be distinguished from a logic low by the impulse having its leading edge be positive going or negative going. This may also be considered changing the phase of the impulse. Thus, under one convention, an impulse whose leading edge is positive going can be considered a logic high and an impulse whose leading edge is negative going can be considered a logic low. Another convention is to use one short train of impulses for one logic state and a different short train of impulses be the other logic state. By using impulses applied to antennas that broadcast the carrierless UWB RF, data is transferred among cores without requiring wiring to communicate among cores. Because the signal is in the RF range, the signal does not require a dedicated line, be it wire or waveguide, to pass from packet switch 20 and cores 26-36 or from cores 26-36 to packet switch 20. The power used controls the distance over which the carrierless UWB RF is effective. Thus, cores 26-36 of core group 22 are designed to have enough power to reach packet switch 20 but not to extend outside of integrated circuit 16. Packet switch 20 may have multiple antennas located in proximity to the various cores to achieve the needed information transfer while keeping power low. By using carrierless UWB RF, there is no, or at least a significantly reduced, wiring needed for carrying signals among the cores and between the cores and packet switch 20. Further the power is significantly reduced with respect to conventional wiring interconnects. One reason is that the data being generated is simply an impulse or series of impulses for defining the logic state of a signal so nearly all of the power is the impulse itself. Also, the power requirement is very low when data is being generated, especially when compared to RF that requires a carrier because there is then an oscillator operating even if no data is being transferred. Using packet technology, packet switch 20 can accumulate packet data from cores 26-36, for example, and then send out completed data assembled from the packet data.

Figure 2:
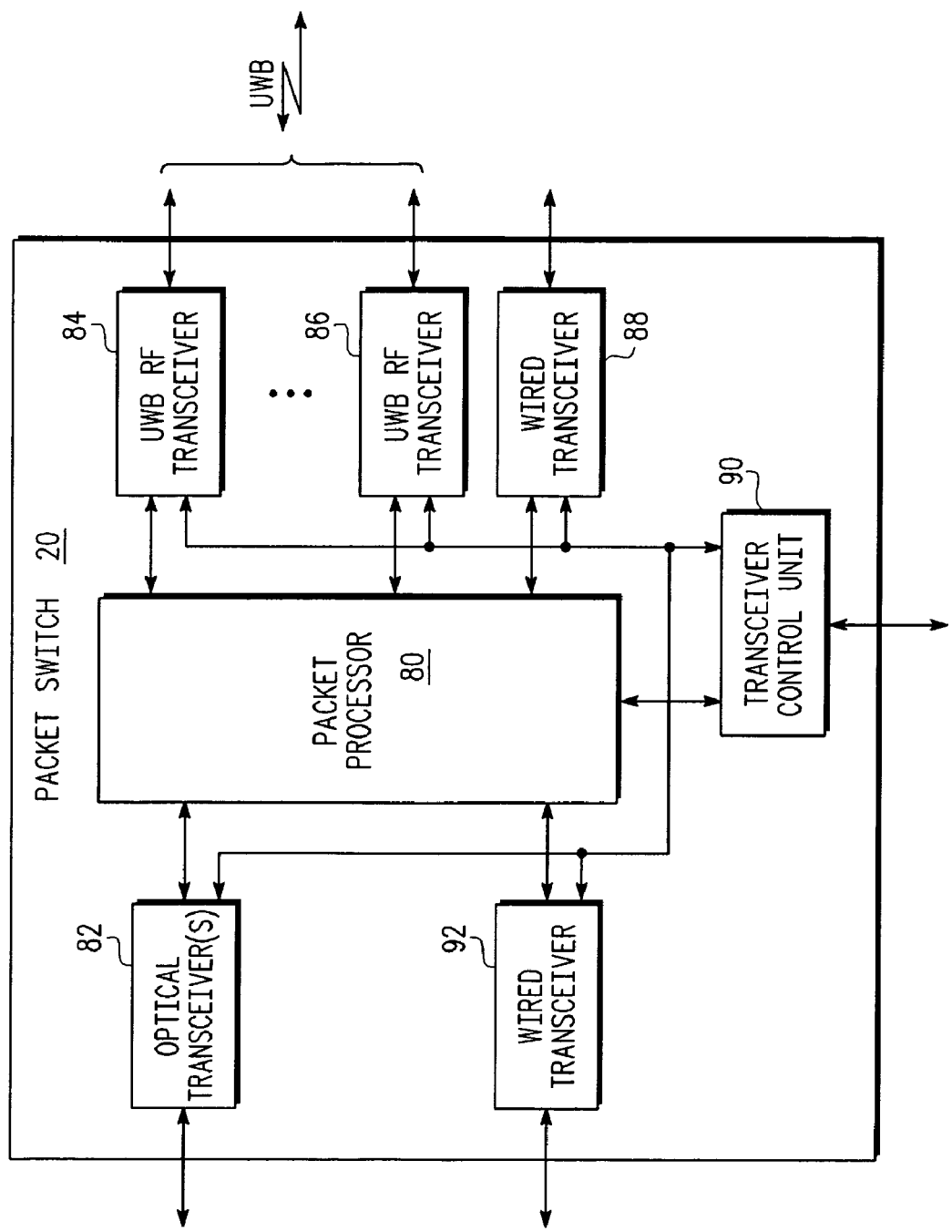
FIG. 2 is a block diagram of a packet switch shown in FIG. 1.

Shown in FIG. 2 is packet switch 20 in more detail. As shown in FIG. 2, packet switch 20 comprises a packet processor 80, an optical transceiver 82, a carrierless UWB RF transceiver 84, a carrierless UWB RF transceiver 86, a wired transceiver 88, a transceiver control unit 90, and a wired transceiver 92. Optical transceiver may include multiple transceivers. Optical transceiver 82 is for providing an external interface for integrated circuit 16 that has an exceptionally high capacity. Optical data rates are currently available at up to terabits (10 to the twelfth bits) per second. Carrierless UWB RF transceivers 84 and 86 are used for communicating with cores 26-36 using carrierless UWB RF and for communicating outside of integrated circuit 16 using carrierless UWB RF. For transmissions outside of integrated circuit 16, the power may be increased. Wired transceiver 88 provides for communicating with cores 26-36 using conventional conductor interconnect. Transceiver control unit 90 is for communicating with a high level controller that may either be in integrated circuit 16 or outside integrated circuit 16. Wired transceiver 92 is for general wired communication between packet processor 80 and resources outside integrated circuit 16.

Figure 3:
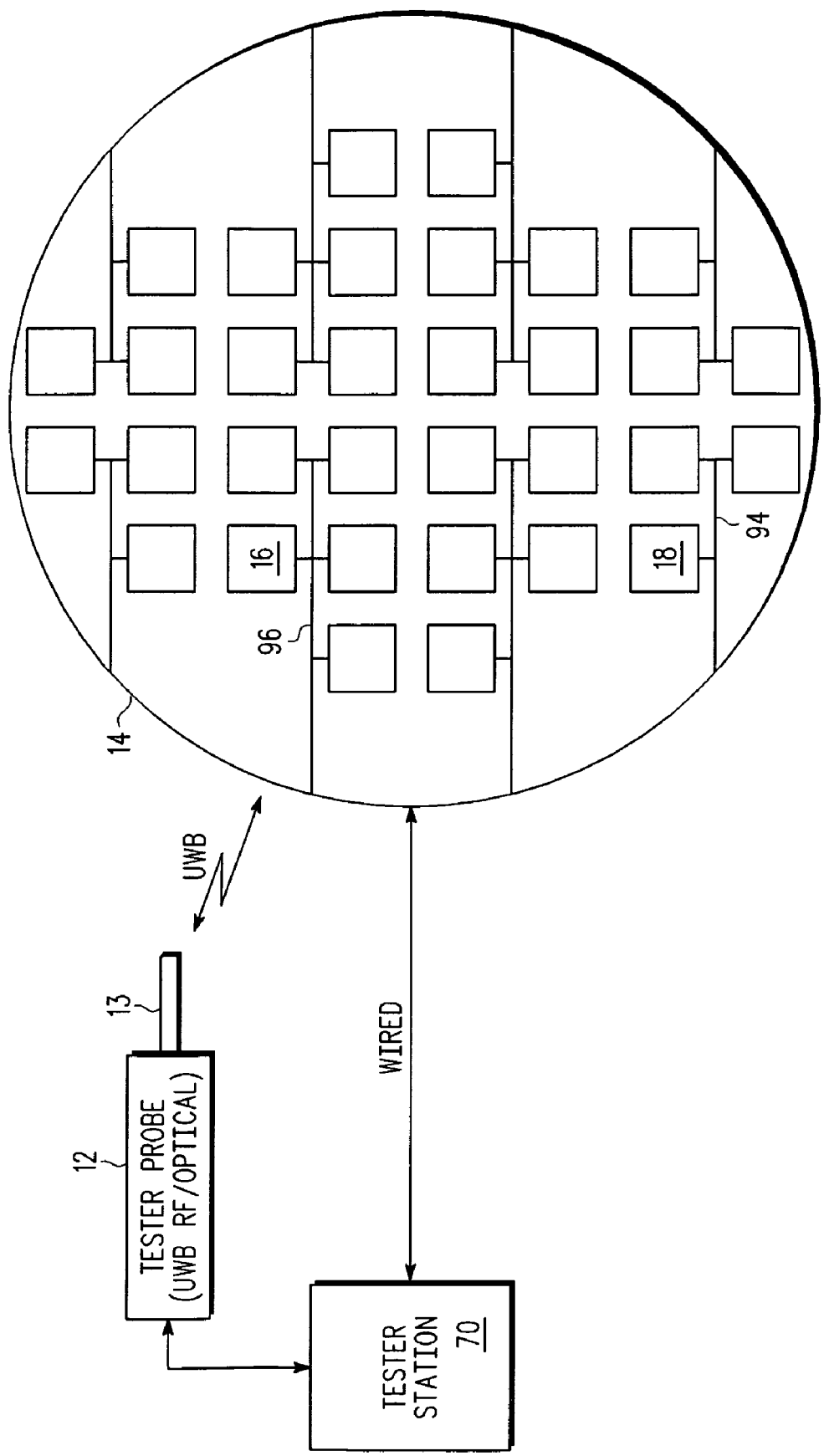
FIG. 3 shows a tester and wafer according to the embodiment.

Shown in FIG. 3 is wafer 14 and tester probe 12 in more pictorial form than as shown in FIG. 1. Also shown in FIG. 3 is tester station 70 having a data link with tester probe 12. Antenna 13 is shown extending from tester probe 12. Also shown in wafer are integrated circuits 16 and 18 as well as many other integrated circuits. All of the integrated circuits are shown having a wired connection to the periphery of wafer. For example, integrated circuits 16 and 18 are connected to wired connecters 96 and 94, respectively. Tester 70, during testing, has a wired connection to the periphery of wafer 14 so that there is a wired connection between each integrated circuit and tester station 70. This may be beneficial for providing power and ground to the integrated circuits during testing and may be used for other purposes as well. For example, multiple integrated circuits may be configured as a scan chain to provide output test values via the scan chain. FIG. 3 shows the carrierless UWB RF communication between the integrated circuits of wafer 14 and tester probe 12. Tester station 70 is used for providing testing signals and for processing results of the tests. Tester station may be programmed to run functions that arise as needed from the test results.

By now it should be appreciated that there has been provided a method for testing one or more integrated circuits. The method includes simultaneously receiving via carrierless UWB radio frequency signaling an input test value from one antenna of a test probe at a first input of a first integrated circuit and at a second input of a second integrated circuit. The method further includes providing, from a first output of the first integrated circuit, a first output test value generated in response to the input test value. The method further includes providing, from a second output of the second integrated circuit, a second output test value generated in response to the input test value. The method may be further characterized by the providing, from the first output of the first integrated circuit, the first output test value generated in response to the input test value further comprising transmitting the first output test value via carrierless UWB radio frequency signaling. The method may be further characterized by the providing, from the first output of the first integrated circuit, the first output test value generated in response to the input test value further comprising transmitting the second output test value via carrierless UWB radio frequency signaling. The method may be further characterized by the first output test value and the second output test value being transmitted via carrierless UWB radio frequency signaling at least partially concurrently with each other. The method may be further characterized by the providing, from the first output of the first integrated circuit, the first output test value generated in response to the input test value comprising transmitting, via wired signaling, the first output test value from the first integrated circuit to a tester station, the test probe coupled to the tester station. The method may be further characterized by the first output of the first integrated circuit and the second output of the second integrated circuit are configured as a scan chain to output to the first output test value and the second output test value. The method may be further characterized by further comprising bringing the one antenna within a predetermined distance of the first and second integrated circuits, but not in physical contact with either of the first or second integrated circuits. The method may be further characterized by the simultaneously receiving comprising simultaneously receiving via carrierless UWB radio frequency signaling the input test value from a plurality of antennas of the test probe to the first input of the first integrated circuit and to the second input of the second integrated circuit. The method may be further characterized by the providing, from the second output of the second integrated circuit, the second output test value generated in response to the input test value comprising transmitting, via optical signaling, the second output test value from the second integrated circuit to a tester station, the test probe coupled to the tester station. The method may further comprise providing a semiconductor wafer, the semiconductor wafer comprising a first die having the first integrated circuit and a second die, spaced apart from the first die, and having the second integrated circuit.

Also described is a method for testing a plurality of die in a wafer. The method includes providing a semiconductor wafer having a first die and a second die. The method further includes simultaneously receiving via carrierless UWB radio frequency signaling an input test value from one antenna of a test probe at a first input of the first die and at a second input of the second die. The method further includes providing, from a first output of the first die, a first output test value generated in response to the input test value. The method further includes providing, from a second output of the second die, a second output test value generated in response to the input test value. The method further includes after the providing the first output test value and the providing the second output test value, singulating the wafer. The method may be further characterized by the providing, from the first output of the first die, the first output test value generated in response to the input test value further comprising transmitting the first output test value via carrierless UWB radio frequency signaling. The method may be further characterized by the providing, from the second output of the second die, the second output test value generated in response to the input test value further comprising transmitting the second output test value via carrierless UWB radio frequency signaling. The method may be further characterized by the first output test value and the second output test value being transmitted via carrierless UWB radio frequency signaling at least partially concurrently with each other. The method may be further characterized by the providing, from the first output of the first die, the first output test value generated in response to the input test value comprising transmitting, via a wire, the first output test value from the first die to a tester station, the test probe coupled to the tester station. The method may be further characterized by the first output of the first die and the second output of the second die are configured as a scan chain to output to the first output test value and the second output test value.

Also described is a tester. The tester includes a tester probe comprising a first antenna, the first antenna simultaneously provides, via carrierless UWB radio frequency signaling, a first input test value to a first input of a first integrated circuit and a second input of a second integrated circuit. The tester further includes a test station, coupled to the tester probe, the test station receives, from the first integrated circuit, a first output test value generated in response to the first input test value and receives, from the second integrated circuit, a second output test value generated in response to the first input test value. The tester may be further characterized by the tester probe further comprising a carrierless UWB radio frequency receiver which receives the first output test value and the second output test value. The tester may be further characterized by the first integrated circuit and the second integrated circuit being located on a same semiconductor wafer when the first antenna simultaneously provides the input test value and when the test station receives the first and second output test values. The tester may be further characterized by the tester probe comprising a plurality of antennas, wherein each of the plurality of antennas simultaneously provides a second input test value to at least two integrated circuit test inputs.

Although the invention is described herein with reference to specific embodiments, various modifications and changes can be made without departing from the scope of the present invention as set forth in the claims below. For example, the tester was shown and described as testing all of the integrated circuits of the wafer simultaneously but it may be beneficial to not test all of them simultaneously. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for testing one or more integrated circuits, comprising:
   simultaneously receiving via carrierless UWB radio frequency signaling an input test value from one antenna of a test probe at a first input of a first integrated circuit and at a second input of a second integrated circuit;
   providing, from a first output of the first integrated circuit, a first output test value generated in response to the input test value by transmitting, via wired signaling, the first output test value from the first integrated circuit to a tester station, the test probe coupled to the tester station; and
   providing, from a second output of the second integrated circuit, a second output test value generated in response to the input test value,
   wherein the first output of the first integrated circuit and the second output of the second integrated circuit are configured as a scan chain to output the first output test value and the second output test value.

2. A method for testing a plurality of die in a wafer comprising:

providing a semiconductor wafer having a first die and a second die;

simultaneously receiving via carrierless UWB radio frequency signaling an input test value from one antenna of a test probe at a first input of the first die and at a second input of the second die;

providing, from a first output of the first die, a first output test value generated in response to the input test value;

providing, from a second output of the second die, a second output test value generated in response to the input test value;

after the providing the first output test value and the providing the second output test value, singulating the wafer; and transmitting, via a wire, the first output test value from the first die to a tester station, the test probe coupled to the tester station.

3. The method of claim 2, wherein the first output of the first die and the second output of the second die are configured as a scan chain to output the first output test value and the second output test value.

* * * * *